United States Patent [19]

Hoffmann et al.

[11] Patent Number: 4,806,452
[45] Date of Patent: Feb. 21, 1989

[54] PRODUCTION OF FLEXOGRAPHIC RELIEF PLATES BY PHOTOPOLYMERIZATION AND DEVELOPMENT WITH A MONOTERPENE DEVELOPER

[75] Inventors: Gerhard Hoffmann, Otterstadt; Karl-Rudolf Kurtz, Heidelberg, both of Fed. Rep. of Germany

[73] Assignee: BASF Aktiengesellschaft, Ludwigshafen, Fed. Rep. of Germany

[21] Appl. No.: 425

[22] Filed: Jan. 5, 1987

[30] Foreign Application Priority Data

Jan. 4, 1986 [DE] Fed. Rep. of Germany ....... 3600116

[51] Int. Cl.$^4$ ............................................... G03F 7/02
[52] U.S. Cl. .................................... 430/306; 430/325; 430/331
[58] Field of Search ........................ 430/331, 306, 325

[56] References Cited

U.S. PATENT DOCUMENTS

| | | |
|---|---|---|
| 1,574,357 | 2/1926 | Beebe et al. . |
| 1,575,143 | 3/1926 | Beebe et al. . |
| 1,587,269 | 6/1926 | Beebe et al. . |
| 1,587,272 | 6/1926 | Beebe et al. . |
| 1,587,273 | 6/1926 | Beebe et al. . |
| 1,751,908 | 3/1930 | Davis et al. . |
| 1,797,210 | 3/1931 | Davis et al. . |
| 1,797,211 | 3/1931 | Davis et al. . |
| 2,760,863 | 8/1956 | Plambeck et al. . |
| 4,339,530 | 7/1982 | Sprinkschnik et al. ............. 430/331 |
| 4,535,054 | 8/1986 | Brault et al. ....................... 430/331 |
| 4,539,288 | 9/1985 | Marrem ............................... 430/331 |
| 4,665,009 | 5/1987 | Brault et al. ....................... 430/331 |

OTHER PUBLICATIONS

Chemical Abstracts vol. 102, Jan. 15, 1985, p. 576, 152-825.
Dr. J. R. Williams, *Photopolymerization*, Eastman Kodak Co., Research Laboratories vol. 13/2, 1969 pp. 227-250.
Krugueger, The Lithographic Process..., 2nd Ed., pp. 84-87, F. A. Brockhouse, Publisher, 1929.

*Primary Examiner*—Jack P. Brammer
*Attorney, Agent, or Firm*—Keil & Weinkauf

[57] ABSTRACT

Relief plates crosslinked by photopolymerization are produced by exposing layers which are crosslinkable by photopolymerization imagewise to actinic light and washing out the noncrosslinked parts of the layers with a developer, by a process in which the developer used contains, as an essential component, a branched or straight-chain, monoolefinically, diolefinically or triolefinically unsaturated acrylic or saturated or monoolefinically, diolefinically or triolefinically unsaturated cyclic aliphatic hydrocarbon, alcohol or ketone of 8 to 15 carbon atoms.

5 Claims, No Drawings

PRODUCTION OF FLEXOGRAPHIC RELIEF PLATES BY PHOTOPOLYMERIZATION AND DEVELOPMENT WITH A MONOTERPENE DEVELOPER

The present invention relates to an improved process for the production of relief plates crosslinked by photopolymerization, by exposing layers which are crosslinkable by photopolymerization imagewise to actinic light and washing out the noncrosslinked parts of the layers with a developer. The present invention furthermore relates to relief plates having improved relief depths and an improved sidewall structure.

Apart from the improvement according to the invention, a process of this type is well known. The developers usually used in such a process are (a) chlorohydrocarbons, such as chloroform, trichloroethylene, tetrachloroethylene or trichloroethane, as such or as a mixture with a lower alcohol, such as n-butanol;

(b) saturated cyclic or acyclic hydrocarbons, such as petroleum ether, hexane, heptane, octane, cyclohexane or methylcyclohexane;

(c) aromatic hydrocarbons, such as benzene, toluene or xylene; or (d) lower aliphatic ketones, such as acetone, methyl ethyl ketone or methyl isobutyl ketone.

The disadvantage of the known procedures is that the developers have to act for a long time in order to achieve a satisfactory washout effect. During this procedure, the relief plates frequently suffer surface swelling, or parts of the relief are under-washed and may be mechanically detached. Furthermore, when conventional, saturated or aromatic hydrocarbons and ketones are used, long drying times are necessary and the feared "positive intrinsic setting" is frequently encountered, i.e. relatively fine image elements project beyond the level of the solid surfaces. Furthermore, these solvents have low flashpoints of less than 21° C., so that the process can only be operated in special, explosion-protected plants. when chlorohydrocarbons are used, their toxicity gives rise to disposal problems. Moreover, relief plates produced using these solvents have an unsatisfactory sidewall structure.

It is an object of the present invention to provide a process for the preparation of relief plates crosslinked by photopolymerization, in which the washout time and the drying time are substantially shorter compared with the conventional process, the relief plates suffer neither surface swelling nor under-washing, and no positive intrinsic setting is encountered, the said process being capable of operation without expensive explosion protection and giving relief plates which possess improved relief depths and an improved sidewall structure.

We have found that this object is achieved by a process for the production of relief plates crosslinked by photopolymerization in which layers which are crosslinkable by photopolymerization are exposed imagewise to actinic light and the noncrosslinked parts of the layers are washed out with a developer, wherein the developer used contains, as an essential component, a branched or straight-chain monoolefinically, diolefinically or triolefinically unsaturated acyclic or saturated or monoolefinically, diolefinically or triolefinically unsaturated cyclic aliphatic hydrocarbon, alcohol or ketone of 8 to 15 carbon atoms.

Examples of suitable hydrocarbons, alcohols or ketones of 8 to 15 carbon atoms to be used according to the invention are oct-1-ene, cyclooctane, cyclooctene, cyclooctanol, cyclooctanone, non-3-ene, monoterpenes and sesquiterpenes (cf. Ullmanns Enzyklopädie der technischen Chemie, 3rd edition, volume 16, 1965, pages 756–766, and volume 17, 1966, pages 1–54) or terpentine oils (cf. Ullmanns Enzyklopadie der technischen Chemie, 3rd edition, volume 16, 1965, pages 768–779), the monoterpenes being advantageous.

Monoterpenes which can be particularly advantageously used according to the invention are

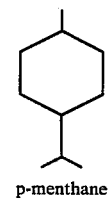

p-menthane

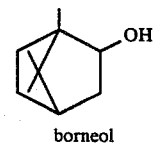

borneol

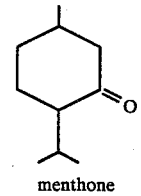

menthone

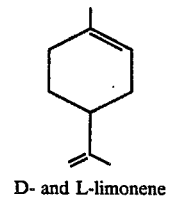

D- and L-limonene

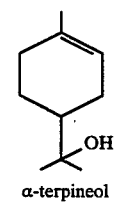

α-terpineol

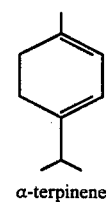

α-terpinene

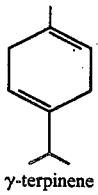

γ-terpinene

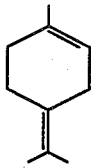

terpinolene

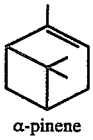

α-pinene

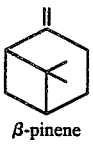

β-pinene

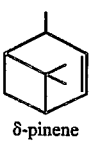

δ-pinene and

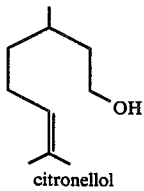

citronellol and mixtures of these, D- and L-limonene and diterpene being preferred, and the mixtures of isomers of limonene obtained from orange peel being very particularly preferred. For the sake of brevity, the latter will be referred to below as limonene.

In addition to the hydrocarbons, alcohols or ketones used according to the invention, up to about 40% by weight of other solvents may also be present in the developer, for example the solvents familiar from the abovementioned prior art, in particular fairly high boiling alcohols, in an amount of 20% by weight.

With regard to the method, the novel process has no special features, i.e. the layers exposed imagewise in the usual way are developed by washing out the noncrosslinked parts of the layers with the developers used according to the invention, in the conventional spray, brush or friction washers at from 20° to 60° C., in particular from 25° to 35° C. We have found that the optimum washout times in the novel process are substantially shorter than those of the conventional procedures, and that, in contrast to the conventional procedures, overwashing, i.e. breaking off of material from the relief plate by mechanical action (breaking of edges), does not occur when the optimum washout times are exceeded. The optimum washout time is the time which is just sufficient to achieve the maximum relief depth during washout. At the same time, relief plates having a more pronounced depth and a very good sidewall structure are obtained, the surface of these relief plates surprisingly being substantially smoother and more uniform than the surface of relief plates produced by the conventional procedures. Moreover, there is substantially less swelling of the image elements than when conventional developers are used. An additional surprising advantage of the novel process is that no deposits are formed in the washers, even after prolonged operation.

When the process according to the invention is carried out, the development step is preceded by conventional imagewise exposure of the layers which are crosslinkable by photopolymerization to actinic light at a wavelength λ of from 230 to 450 nm, in particular from 300 to 450 nm. Examples of light sources which are suitable for this purpose are sunlight, commercial UV fluorescent tubes, medium pressure, high pressure and low pressure mercury lamps, superactinic fluorescent tubes, pulsed xenon lamps, metal iodide-doped lamps and carbon arc lamps.

In the course of the novel process, the development step is followed by drying of the relief plates. Thereafter, the said plates can also be halogenated in halogen-containing or halogen-donating baths, further washed in reducing baths and dried again. Alternatively or subsequently to this treatment, the relief plates may furthermore be exposed uniformly to actinic light.

Another advantage of the novel process is that it can be applied successfully to a large number of conventional layers which are crosslinkable by photopolymerization. Such known layers mainly contain (A) one or more binders based on elastomeric polymers, (B) one or more photopolymerizable monomers which are compatible with these binders, and (C) one or more photoinitiators.

However, they may also contain other suitable additives, such as thermal polymerization inhibitors, dyes, pigments, photochromic substances, antihalation agents, plasticizers, antioxidants, antiozonants, agents for improving the relief structure, crosslinking agents, fluxes, mold release agents, fillers and/or reinforcing fillers, in active amounts.

The process according to the invention can be applied very successfully to layers which contain, as binders A, polymers of conjugated aliphatic dienes of 4 or 5 carbon atoms. Examples of advantageous binders A are natural rubber, the homopolymers of butadiene or isoprene, copolymers of butadiene with isoprene and copolymers of butadiene and/or isoprene with other copolymerizable monomers, such as styrene, α-methylstyrene, vinyltoluene, acrylonitrile or alkyl (meth)acrylates where alkyl is of 1 to 8 carbon atoms, e.g. nitrile rubbers as described in EP-A-No. 64 564, random styrene/butadiene, styrene/isoprene and styrene/isoprene/butadiene copolymers containing from 10 to 50% by weight of copolymerized styrene, and block copolymers of styrene monomers and butadiene and/or isoprene, as described in German Published Application DAS No. 2,215,090 and German Laid-Open Applications DOS No. 2,456,439 and DOS No. 2,942,183.

Among these, the block copolymers according to German Laid-Open Application DOS No. 2,942,183 are particularly advantageous.

The novel process can be applied with excellent success to layers which contain, as binders A, elastomeric three-block copolymers of the X-Y-Z type according to German Laid-Open Application DOS No. 2,942,183, in which copolymer X is a thermoplastic, nonresilient styrene polymer block, Y is an elastomeric butadiene and/or isoprene polymer block and Z is an elastomeric polymer block of butadiene and/or isoprene and, if appropriate, styrene, this block differing from Y.

The process according to the invention can be applied to the layers as such, which are crosslinkable by photopolymerization, or to crosslinkable layers which are laminated with further suitable sheet-like layers. Laminates of this type are generally referred to as multilayer elements (cf. German Laid-Open Application DOS No. 2,942,183 and DOS No. 2,444,118).

The relief plates obtained by the process according to the invention can be used as decorative surfaces, as photoresist images or as lithographic, letterpress or flexographic printing plates. They are particularly suitable for flexographic printing plates for continuous printing.

EXAMPLES AND COMPARATIVE EXPERIMENTS

In the examples and comparative experiments below, the swelling in terms of thickness was determined, in percent, by gravimetric measurements. The quality of the sidewall structure of the image elements was assessed visually with the aid of a microscope; the criteria employed were steepness, degree of undermining of the sidewalls and degree of rounding of the edges.

EXAMPLE 1

A commercial flexographic printing plate was produced in a conventional manner. The base film used was a 125 μm thick polyethylene terephthalate film, which was coated with a 0.3 μm thick polyurethane adhesive layer before the photocrosslinkable layer was applied. The layer which was capable of being crosslinked by photopolymerization was 700 μm thick and contained (A) 90.917% by weight of block copolymer XYZ having an intrinsic viscosity of 164.9 ml/g and a total molecular weight of 190,000 and consisting of 10% by weight of polystyrene as the X block, 70% by weight of polyisoprene having a glass transition temperature Tg of −53° C. as the Y block, and 20% by weight of polyisoprene containing 53% by weight of 3,4-structures and having a glass transition temperature Tg of +10° C. as the Z block, the percentages being based on XYZ, B) 7.268% by weight of hexane-1,6-diol diacrylate, (C) 1.350% by weight of benzil dimethyl acetal and, as additives, 0.457% by weight of 2,6-di-tert.-butyl-p-cresol and 0.008% by weight of Solvent Black 3 (C.I. 26,150). A 2 μm thick layer of cyclized rubber having a high degree of cyclization was used as the protective layer.

This flexographic printing plate was first preexposed uniformly from the back in a tubular exposure unit for 2 minutes, then exposed imagewise for 22 minutes through a photographic negative placed on the protective layer, and developed with limonene at 30° C. in a friction washer which was not explosion-proof. The optimum washout time was 4 minutes. The sidewall structure of the image elements was satisfactory, and rounding of the relief edges and undermining of the sidewalls were not observed. The swelling in terms of the thickness was 1.65%.

The flexographic printing plate was dried for 2 hours at 80° C., stored at room temperature for 15 hours, subjected to a conventional aftertreatment with an aqueous bromine solution and dried again.

The aftertreated flexographic printing plate was clamped on a printing cylinder in a flexographic printing press and gave excellent printing results without any loss of information compared with the hotographic negative.

EXAMPLE 2

The procedure described in Example 1 was followed, except that a spray washer which had not been explosion-proofed was used instead of the corresponding friction washer. The optimum washout time was 4.5 minutes. The quality of the sidewall structure, the swelling in terms of thickness and the quality of the printing results were identical to those of Example 1.

COMPARATIVE EXPERIMENT 1

The procedure described in Example 1 was followed, except that tetrachloroethylene was used instead of limonene. The optimum washout time was 6.5 minutes and the swelling in terms of thickness was 3%.

COMPARATIVE EXPERIMENT 2

The procedure described in Example 1 was followed, except that cyclohexane was used instead of limonene and, instead of the nonexplosion-proofed friction washer, it was necessary to use a friction washer provided with expensive explosion-proofing. The optimum washout time was 6 minutes, and the swelling in terms of thickness was 6%. The sidewall structure of the image elements was unsatisfactory (undermining, rounded edges).

EXAMPLE 3

The procedure described in Example 1 was followed. The washer contained 90 l of limonene, with which a total of 50 imagewise exposed flexographic printing plates which measured 200×300 mm and had a non-crosslinked part amounting to 78% were exposed. No deposits and soiling were observed in the washer.

COMPARATIVE EXPERIMENT 3

The procedure described in Example 3 was followed, except that tetrachloroethylene was used instead of limonene. Deposits and soiling were observed in the washer at the upper edge of the bath liquid and on the brushes.

EXAMPLE 4

The procedure described in Example 1 was followed, except that washing out was effected for 8 minutes longer than the optimum washout time of 4 minutes. In spite of this, no over-washing was observed.

COMPARATIVE EXPERIMENT 4

The procedure described in Example 4 was followed, except that tetrachloroethylene was used instead of limonene. Over-washing occurred, manifesting itself in particular in breaking of the edges. Furthermore, the sidewalls of isolated fine image sections were undermined.

We claim:

1. An improved process for preparing a photopolymerized flexographic relief printing plate from a photosensitive element comprising a photopolymerizable layer consisting essentially of
   (A) at least one elastomeric polymer as the binder,
   (B) at least one photopolymerizable monomer compatible with said binder (A) and
   (C) at least one photoinitiator, by
      (i) image-wise exposing said photopolymerizable layer of said element to actinic light and
      (ii) washing out the unexposed, nonphotopolymerized parts of said layer with a developer, thereby obtaining a photopolymerized flexographic relief plate,
the improvement comprising: washing out the nonphotopolymerized parts of the irradiated photopolymerizable layer with a developer consisting essentially of at least one monoterpene and 0 to 40% by weight of an additonal solvent.

2. The process of claim 1 wherein said at least one monoterpene is selected from the group consisting of p-menthane, borneol, menthone, D-limonene, L-limonene, α-terpineol, α-terpinene, γ-terpinene, terpinolene, α-pinene, β-pinene, δ-pinene and citronellol.

3. The process of claim 1 wherein said at least one monoterpene is limonene.

4. The process of claim 1 wherein the developer consists essentially of limonene.

5. An improved process for preparing a photopolymerized flexographic relief printing plate from a photosensitive element comprising a photopolymerizable layer consisting essentially of
   (A) at least one elastomeric polymer as the binder,
   (B) at least one photopolymerizable monomer compatible with said binder (A) and
   (C) at least one photoinitiator, by
      (i) image-wise exposing said photopolymerizable layer of said element to actinic light and
      (ii) washing out the unexposed, nonphotopolymerized parts of said layer with a developer, thereby obtaining a photopolymerized flexographic relief plate,
the improvement comprising: washing out the nonphotopolymerized parts of the irradiated photopolymerizable layer with a developer consisting of limonene.

* * * * *